(12) United States Patent
Bonilla et al.

(10) Patent No.: US 9,105,642 B2
(45) Date of Patent: Aug. 11, 2015

(54) INTERLEVEL DIELECTRIC STACK FOR INTERCONNECT STRUCTURES

(71) Applicant: International Business Machines Corporation, Armonk, NY (US)

(72) Inventors: Griselda Bonilla, Fishkill, NY (US); Alfred Grill, White Plains, NY (US); Thomas J. Haigh, Jr., Claverack, NY (US); Satyanarayana V. Nitta, Poughquag, NY (US); Son Nguyen, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/286,008

(22) Filed: May 23, 2014

(65) Prior Publication Data

US 2014/0256154 A1    Sep. 11, 2014

Related U.S. Application Data

(62) Division of application No. 13/344,009, filed on Jan. 5, 2012, now Pat. No. 8,779,600.

(51) Int. Cl.
*H01L 23/538* (2006.01)
*H01L 23/532* (2006.01)
*H01L 21/768* (2006.01)
*H01L 21/02* (2006.01)

(52) U.S. Cl.
CPC ...... *H01L 23/5384* (2013.01); *H01L 21/02167* (2013.01); *H01L 21/02274* (2013.01); *H01L 21/76801* (2013.01); *H01L 21/76825* (2013.01); *H01L 21/76832* (2013.01); *H01L 21/76834* (2013.01); *H01L 23/5329* (2013.01); *H01L 23/53295* (2013.01); *H01L 2924/0002* (2013.01); *Y10T 428/249969* (2015.04)

(58) Field of Classification Search
CPC .............................. H01L 21/31; H01L 23/538
USPC .......................... 438/761; 257/774, E23.174
See application file for complete search history.

(56) References Cited

U.S. PATENT DOCUMENTS 6,407,011 B1    6/2002    Ikeda et al.
6,740,539 B2    5/2004    Conti et al.
(Continued)

OTHER PUBLICATIONS

D. Edelstein, et al.—"Reliability, yield and performance of a 90nm SOI/Cu/SiCOH Technology"—Proceedings of the IEEE 2004 International Interconnect Technology Conference, Jun. 7-9, pp. 214-216.

(Continued)

*Primary Examiner* — Elias M Ullah
(74) *Attorney, Agent, or Firm* — Catherine Ivers

(57) ABSTRACT

A dielectric stack and method of depositing the stack to a substrate using a single step deposition process. The dielectric stack includes a dense layer and a porous layer of the same elemental compound with different compositional atomic percentage, density, and porosity. The stack enhances mechanical modulus strength and enhances oxidation and copper diffusion barrier properties. The dielectric stack has inorganic or hybrid inorganic-organic random three-dimensional covalent bonding throughout the network, which contain different regions of different chemical compositions such as a cap component adjacent to a low-k component of the same type of material but with higher porosity.

26 Claims, 6 Drawing Sheets

(56) References Cited

U.S. PATENT DOCUMENTS

| | | |
|---|---|---|
| 6,977,438 B2 | 12/2005 | Usami |
| 7,180,191 B2 | 2/2007 | Sasaki et al. |
| 7,394,154 B2 | 7/2008 | McLaughlin et al. |
| 2005/0202685 A1* | 9/2005 | Huang et al. .................. 438/780 |
| 2008/0009141 A1 | 1/2008 | Dubois et al. |
| 2010/0151675 A1 | 6/2010 | Tada et al. |
| 2011/0127158 A1 | 6/2011 | Hamaya et al. |
| 2012/0032311 A1* | 2/2012 | Gates et al. .................. 257/635 |

OTHER PUBLICATIONS

A. Grill, et al.—"Interface engineering for high interfacial strength between SiCOH and porous SiCOH interconnect dielectrics and diffusion caps"—J. Appl. Phys., vol. 103, 2008, 054104, 6 pages.

Office Action—Feb. 3, 2015 Appl. No. 201310000706.3 Filed Jan. 4, 2013.

* cited by examiner

| Plasma CVD Cap Film/ k | E (GPa) | H (GPa) | Av. Stress (MPa) | Comment |
|---|---|---|---|---|
| TMS/NH3 SiCNx Cap (k~5.3-5.7) | 100-110 | ~11-12 | -(400-900) | Compressive stress → Tensile stress post UV cure. Good oxidation/Cu barrier |
| TMS/NH3/C2H2 top cap (350C),k~3.4 | 36.4 | 4.9 | -65 | Stress: 0 to -10 MPa after 65sec UV. Low k, average oxidation/Cu barrier |
| DMSCP/NH3 top cap (200-250C) , k ~4.4 | 12 | 1.05 | -40 | As-deposited cap is porous with weakly bond hydrocarbon. High leakage. Average/low oxidation/Cu barrier |
| DMSCP/NH3 Top Cap (250C) +max 195sec UV), k~2.6-3.1, porous SiCNx | 17 | 1.76 | Range -16 to -4 | Slightly compressive stress post UV. Porous SiCNx (up to 12 % porosity, k~2.6) |
| DMSCP/NH3 (350C) k ~3.7-4.2 | 39.8 | 4.2 | -180 to -280 MPa | Stress become more compressive with increase Nitrogen concentration |
| DMSCP/NH3 (350C +max 195sec UV), k~3.9-4.6, dense SiCNx | 43.4 | 4.8 | -30 to -10 | UV cure change film to low compressive stress. Good/Average oxidation/Cu barrier |

DMSCP= DiMethylSilaCycloPentane     TMS = TriMethyl Silane

Fig. 2

| Property | |
|---|---|
| K at 150°C | 300 nm SiCNxH/pSiCNyH stack<br>2.6 (pSiCNyH to 4.6 (SiCNxH) |
| 150°C Intrinsic Breakdown, MV/cm | ~4.7-50 (bilayer) |
| Leakage at 1MV, 2 MV, 150°C in A/cm² | 5 E⁻⁹ @ 1MV<br>1 E⁻⁴ @ 2MV |
| Modulus, GPa (1 micron thick) | ~40-104 for SiCNxH bottom layer<br>12-26 for Low k cap SiCNyH top layer |
| Hardness, GPa (1 micron thick) | 10-12.5 for bottom dense SiCNx<br>2.5-4.3 for top low k porous SiCNyH |
| Stress, MPa | 220 – 450 (Compressive) as dep<br>100-250 (compressive) post 180 sec UV cure |
| Adhesion to Cu (J/m2)<br>Adhesion to p-SiCOH(J/m2) | 5.2 (average)<br>4.2 (k=2.7), 3.62 (k=2.4), 3.26 (k=2.2) |
| Density by XRR (g / cm-3) | 1.90-2.05 for bottom dense SiCNx<br>1.4-1.6 for top low K, p SiCNyH |
| Cu diffusion Barrier /Oxidation | Very good (SiCNxH) to Average (SiCNyHd) |

Fig. 3

By RBS - Accuracy +/- 0.5 a/o %, Hydrogen Nuclear reaction analysis (NRA) data and Hydrogen Forward Scattering (HFS)
Note : *Ellipsometric Porosity (EP) measurement with Toluene, ** Reference PECVD SiNx measure by NRA

| Sample | Porosity* (%) | Composition (atomic %) | | | | Density (atoms/cm3) |
|---|---|---|---|---|---|---|
| | | H | C | N | O | Si | |
| 1) SiCNxH layer (TMS+NH3) | 0 | 33 | 22 | 15 | 1 | 29 | 8.40E+22 |
| 2) Top layer SiCNyH (TMS+NH3+C2H4) | 0 | 46 | 30 | 4 | 2 | 18 | 8.70E+22 |
| 3) Top pSiCNyH layer (DMSCP/NH3) 250C dep, UV cure 400C | 12.5 % | 41 | 29 | 3 | 8 | 19 | 7.40E+22 |

Fig. 4

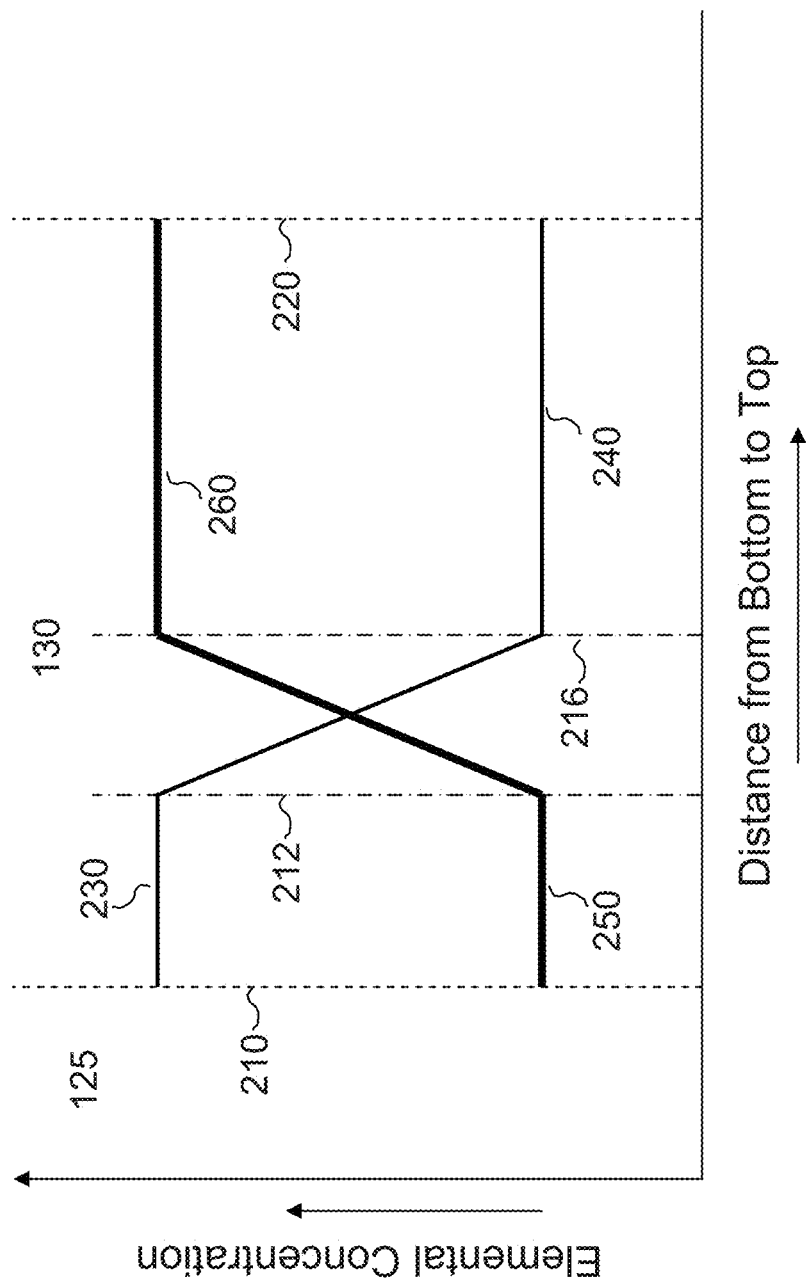

INTERLEVEL DIELECTRIC STACK FOR INTERCONNECT STRUCTURES

CROSS-REFERENCE TO RELATED APPLICATIONS

This application is a divisional of and claims priority from co-pending U.S. patent application Ser. No. 13/344,009 filed Jan. 5, 2012, the entire contents of which are incorporated herein by reference.

BACKGROUND OF THE INVENTION

1. Field of the Invention

The present invention relates to interconnect structures in semiconductor devices. More specifically, the present invention relates to an interlevel dielectric stack containing a dense layer and a porous layer of the same chemical composition.

2. Description of the Related Art

Current copper back end of the line interconnect fabrication requires the use of a copper cap, graded adhesion layer and intra/interlevel dielectric and SiCOH stack. As the stack and the interlevel dielectric thickness become smaller, the effective dielectric constant, k, of the stack becomes higher reducing the advantage of using an ultra-low k dielectric. Furthermore, due to weak mechanical properties of the ultra-low k, flopping of the inter-level dielectric stack has been observed in high aspect ratio structures during fabrication. In addition, the electrical breakdown of the porous SiCOH is worsening as the thickness is reduced below 30 nm.

A new high modulus dielectric-cap structure with low effective k is required for enabling the fabrication of the interconnect structure of 14 nm and beyond technology with low effective k values. Performance of integrated circuits and their density has been improved continuously through the shrinking of the active devices according to Moore's law. Until the 0.25 μm technology node, this was accomplished using the same materials, that is, silicon semiconductor, silicon oxide dielectrics and aluminum, as the interconnect metal. At the 0.25 μm technology node this paradigm changed because the increased RC delay of the electrical signals through the interconnect became a barrier to further improvement of the VLSI performance and new materials had to be introduced to reduce the RC.

Copper was introduced at the 0.22 nm technology node to reduce both resistance and capacitance by appropriate line scaling relative to aluminum in a hierarchical design. Further reduction of the capacitance could be realized much later through the introduction of low-k plasma enhanced chemical vapor deposition (PECVD) SiCOH dielectrics and SiCNH copper cap with a dielectric constant k=2.7-3.0 and k=5.3 at the 90 nm-65 nm nodes, after many other low-k dielectrics <2.4 has fail integration effort at 32 nm and 22 nm node to lower mechanical modulus (<10 GPa) and high porosity (>20%). In addition, the SiCNH and SiCOH film also required an adhesion layer ($SiO_2$) that has higher k and increase the overall effective dielectric constant. Furthermore, the reduction of SiCNH cap thickness is difficult due to SiCOH and porous SiCOH dielectric is a poor Cu diffusion and oxidation barrier.

In order to maintain or even reduce the interconnect capacitance at the decreasing dimensions of later technology nodes, the development of new high modulus composite copper cap and dielectrics with reduced dielectric constants are required to achieve lower effective k but with excellent mechanical modulus properties, enhance oxidation barrier and copper diffusion barrier properties. By adjusting the PECVD conditions and using the same precursor chemistry as for the copper cap deposition, a new $SiCN_xH$/porous $SiCN_yH$ composite layer of copper cap/interlevel dielectric has been developed for high modulus and low effective k, where both copper cap and interlevel dielectric layer can act as good oxidation and copper diffusion.

SUMMARY OF THE INVENTION

The present invention includes a dielectric stack and method of depositing the stack to a substrate using a single step deposition process. The dielectric stack includes a dense layer and a porous layer of the same elemental compound with different compositional atomic percentage, density, and porosity. The stack enhances mechanical modulus strength and enhances oxidation and copper diffusion barrier properties. The dielectric stack has inorganic or hybrid inorganic-organic random three-dimensional covalent bonding throughout the network, which contain different regions of different chemical compositions such as a cap component adjacent to a low-k component of the same type of material but with higher porosity.

According to an aspect of the present invention, an interconnect structure is provided. The interconnect structure includes: a device level; at least a first wiring level and a second wiring level; at least one via and one conductive line connecting the first wiring level and the second wiring level; and a dielectric stack in at least one of the first and second wiring level comprising a first layer of silicon, carbon, nitrogen and hydrogen, and a second layer of silicon, carbon, nitrogen and hydrogen, wherein the first layer is dense and the second layer is porous.

According to another aspect of the present invention, a dielectric stack is provided. The dielectric stack includes: a first layer including concentrations of silicon (Si), carbon (C), nitrogen (N) and hydrogen (H); a transition layer including a composition of graded nitrogen (N) and graded carbon (C); and a second layer including concentrations of silicon (Si), carbon (C), nitrogen (N) and hydrogen (H); wherein the second layer is carbon-rich and is porous; and wherein the first layer is dense and nitrogen-rich.

According to a further aspect of the present invention, a method for forming a dielectric stack structure is provided. The method includes: introducing in a reactor a first vapor precursor of at least one of dimethylsilacyclopentane (DMSCP) and trimethylsilane (TMS) and a second vapor precursor of at least one of ammonia and nitrogen gas on a substrate; striking a plasma in the reactor; depositing a first layer of silicon, carbon, nitrogen and hydrogen on the substrate; reducing the flow rate of the second vapor precursor in the reactor; and depositing a second layer of silicon, carbon, nitrogen and hydrogen into the reactor.

BRIEF DESCRIPTION OF THE DRAWINGS

The features and elements of the present invention are set forth with respect to the appended claims and illustrated in the drawings.

FIG. 2 is a chart showing the mechanical properties of various PECVD $SiCN_xH$/p-$SiCN_yH$ stack dielectrics.

FIG. 3 is a chart showing typical $SiCN_xH$/p-$SiCN_yH$ stack properties deposited and post UV cure with TMS (or DMSCP) and $NH_3$ precursors.

FIG. 4 is a chart showing typical compositional analysis of $SiCN_xH$/p-$SiCN_yH$.

FIG. 5 is a graphical depiction of nitrogen and carbon concentration in a SiCN$_x$H/p-SiCN$_y$H dielectric stack.

DETAILED DESCRIPTION OF THE PREFERRED EMBODIMENTS

The following describes embodiments of the present invention with reference to the drawings. The embodiments are illustrations of the invention, which can be embodied in various forms. The present invention is not limited to the embodiments described below, rather representative for teaching one skilled in the art how to make and use it. Some aspects of the drawings repeat from one drawing to the next. The aspects retain their same numbering from their first appearance throughout each of the preceding drawings.

The present invention includes a dielectric stack and method of depositing the stack to a substrate using a single step deposition process. The dielectric stack includes a dense layer and a porous layer of the same elemental compound with different compositional atomic percentage, density, and porosity. The stack enhances mechanical modulus strength and enhances oxidation and copper diffusion barrier properties. The dielectric stack has inorganic or hybrid inorganic-organic random three-dimensional covalent bonding throughout the network, which contain different regions of different chemical compositions such as a cap component adjacent to a low-k component of the same type of material but with higher porosity.

Figure 1:
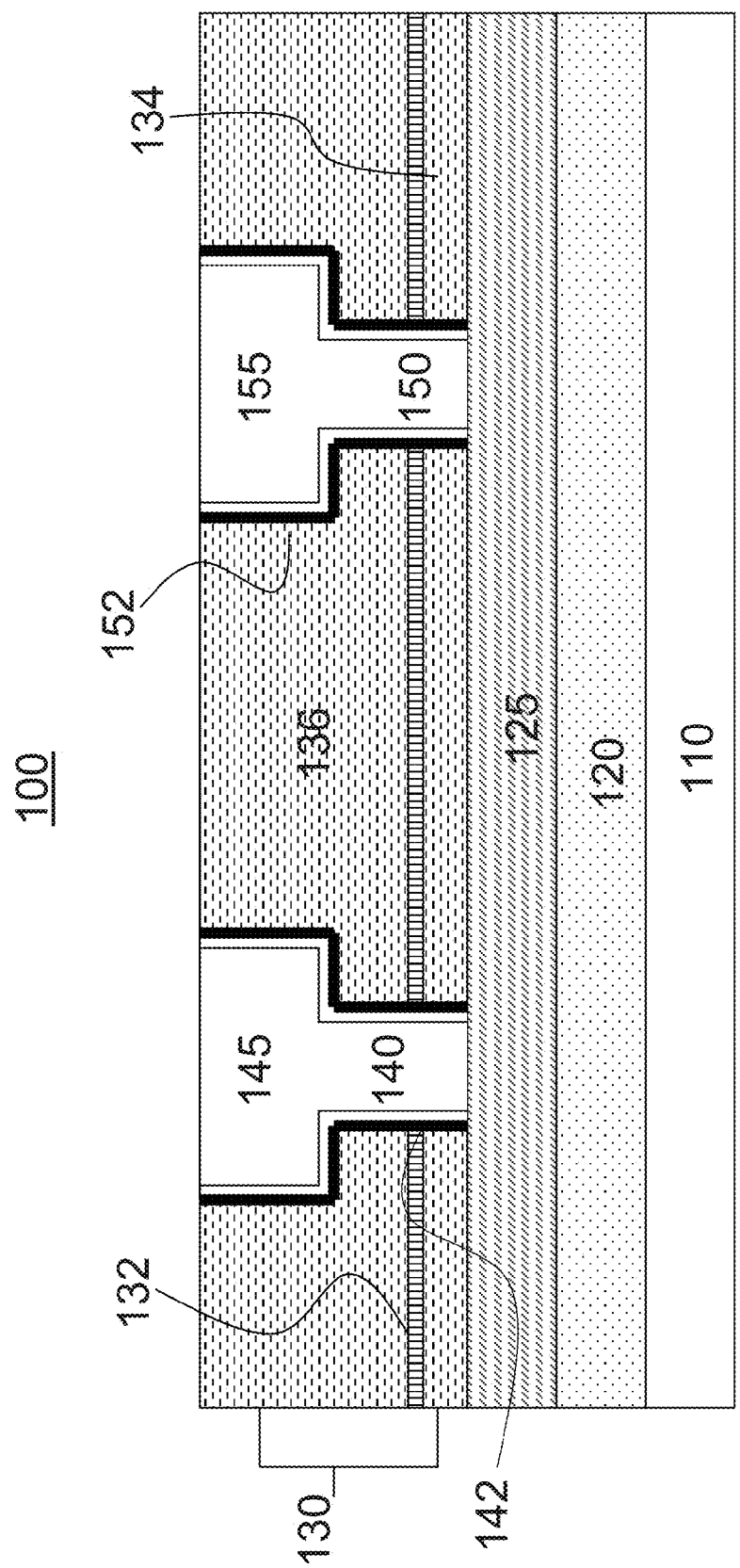
FIG. 1 is a cross-sectional view of an interconnect structure according to an embodiment of the present invention.

FIG. 1 shows a cross-sectional view of an interconnect structure 100 on a semiconductor chip having a substrate 110, device level 120, and wiring levels 125 and 130. Optionally, an additional wiring level may be included above wiring level 130. Substrate 110 may be a bulk semiconductor such as silicon (Si), or a silicon-on-insulator (SOI) substrate. Device level 120 may include, for example, n- and p-type field effect transistors (FETs), n- and p-type bipolar transistors, other transistors or memory structures formed in a semiconductor layer, which may be bulk silicon (Si) or SOI. The devices may be interconnected, for example, to form complementary metal oxide silicon (CMOS) logic, bipolar CMOS (BiC-MOS), FETs and bipolar circuitry. Other kinds of integrated circuit devices or structures may be included within device level 120. The wiring levels are interconnected to each other by means of vertical vias 140 and 150. The wiring levels are comprised of a copper (Cu) line and an intralevel dielectric between wires in each wiring level.

Wiring level 130 includes a dielectric stack, vias 140 and 150, and conductive lines 145 and 155. Vias 140 and 150, and conductive lines 145 and 155 are comprised of copper (Cu) and may be formed by a single or dual damascene process. Vias 140 and 150 are surrounded by metal liners 142 and 152 respectively, which provide a diffusion barrier to the copper (Cu) in the respective via and conductive line. Metal liners 142 and 152 provide strong adhesion to the dielectric stack. The dielectric stack provides strong adhesion to wiring levels 125 and 135. The terms "strong adhesions" and "strong adhesion contact" are used herein to mean the layers or material show an adhesion strength measured in a 4-pointbend adhesion test of greater than 3.5 Joule/meter$^2$ and preferably greater than 4.0 Joule/meter$^2$.

The dielectric stack includes a first dielectric layer 134, a second dielectric layer 136 and a transition layer 132 between layers 134 and 136. First dielectric layer 134 and second dielectric layer 136 includes different concentrations of silicon (Si), carbon (C), nitrogen (N) and hydrogen. Second dielectric layer 136 is carbon-rich and porous. Transition layer 132 includes a composition of graded nitrogen (N) and graded carbon (C). First dielectric layer 134 is nitrogen-rich, making it denser than second dielectric layer 136. First dielectric layer 134 has a dielectric constant in the range of about k=3.5 to about k=5. Second dielectric layer 136 has a dielectric constant in the range of about k=2.4 to about k=3. The modulus of the first and second dielectric layers is in the range of about 17 GPa to about 30 GPa. The thickness of the first dielectric layer 134 is in the range of about 15 nm to about 500 nm. The thickness of the second dielectric layer 136 is in the range of about 50 nm to about 500 nm.

The overall modulus of the dielectric stack is greater than 12 GPa and the effective dielectric constant is about k<3.2. The dielectric stack is comprised of SiCN$_x$H and SiCN$_y$H, where x is greater than or equal to 10 atomic % and y is less than 10 atomic %. Moreover, the SiCN$_y$H layer can have up to about 15% porosity. The carbon concentration of the SiCN$_y$H layer is about 5 atomic % to about 25 atomic % higher than the carbon concentration in the SiCN$_x$H layer.

First dielectric layer 134 and second dielectric layer 136 are comprised of SiCN$_x$H and p-SiCN$_y$H respectively. The layers of SiCN$_x$H and p-SiCN$_y$H are deposited sequentially in a commercial 300 nm plasma enhanced chemical vapor deposition (PECVD) system using either trimethylsilane (TMS) or dimethylsilacyclopentane (DMSCP) in conjunction with ammonia (NH$_3$) or nitrogen (N$_2$) gas reactant at a temperature in the range of about 100° C. to about 400° C., preferably in the range of about 250° C. to about 350° C. using 13.56 MHz RF frequencies. Ultraviolet (UV) curing is used on layers deposited at lower temperatures in the range. Optionally, an ethylene (C$_2$H$_4$) porogen precursor or other hydrocarbon porogen may be added during the second layer deposition to increase the carbon concentration and produce increased porosity.

First dielectric layer 134 is deposited with a high flow rate (>5:1 molar ratio) of NH$_3$/TMS or NH$_3$/DMSCP. Second dielectric layer 136 is deposited with a low flow rate (<5:1 molar ratio) of NH$_3$/TMS or NH$_3$/DMSCP by ramping down quickly the NH$_3$ flow. An ultraviolet (UV) curing preferably at about 350° C. may be used if the second dielectric layer 136 is deposited at a low temperature in the range.

First dielectric layer 134 is generally a nitrogen-rich silicon carbon nitride film deposited with high NH$_3$/TMS or NH$_3$/DMSCP ratios preferably at about 350° C. First dielectric layer 134 has more Si—N bonding (N>=14 atomic %) in order for the layer to remain a good barrier to oxygen and copper diffusion.

Second dielectric layer 136 is generally deposited with a low NH$_3$/TMS or NH$_3$/DMSCP ratio and is a carbon-rich silicon carbon nitride containing more carbon (>=33 atomic %) and low nitrogen (<=4 atomic %). Second dielectric layer 136 is preferably deposited at about 250° C. and then an ultraviolet curing. Preferably, second dielectric layer 136 has a lower density, up to 12% porosity and a dielectric constant of approximately k=2.6.

The overall dielectric constant value for the dielectric stack can be reduced to about k=3.2 or less while retaining good mechanical strength. The mechanical properties improve further as first dielectric layer 134 gets denser. The overall mechanical, electrical and physical properties are shown in FIG. 2. Typical compositions of the SiCN$_x$H deposited with NH$_3$/TMS, SiCN$_y$H deposited with NH$_3$/TMS/C$_2$H$_4$ and SiCN$_y$H deposited with NH$_3$/DMSCP are shown in FIG. 3 and FIG. 4.

FIG. 5 is a graph showing an estimate relative concentration profiles of nitrogen and carbon in the dielectric stack in wiring level 130. The ordinate represents relative concentration of nitrogen and carbon atoms and the abscissa represents distance from bottom to top of wiring levels 125 and 130. An upper surface of wiring level 125 is indicated by reference line 210. An upper surface of wiring level 130 is indicated by reference line 220. The first dielectric layer 134 extends from reference line 210 to reference line 212. The transition layer 130 extends from reference line 212 to reference line 216. The second dielectric layer 136 extends from reference line 216 to reference line 220.

The relative concentration of nitrogen in first dielectric layer 134 is high, where x is a constant of about 10 atomic % to about 20 atomic %, as shown by curve 230. The relative concentration of nitrogen in second dielectric layer 136 drops down to a constant of about 5 atomic % to about 0 atomic percent, as shown by curve 240. The relative concentrations of carbon are inversely related to that of nitrogen. In first dielectric layer 134 the relative concentration of carbon is low, as shown by curve 250. In second dielectric layer 136 the relative concentration of carbon is high, as shown by curve 240.

Figure 6:
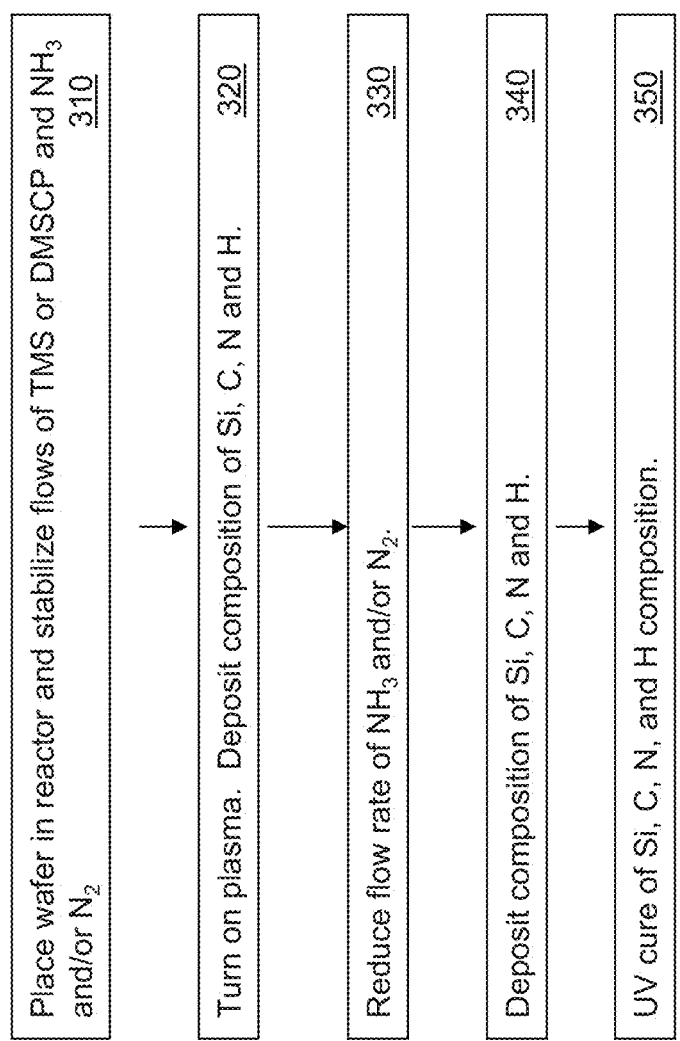
FIG. 6 is a flow chart depicting the process of deposition of a SiCN$_x$H/p-SiCN$_y$H dielectric stack according to an aspect of the present invention.

Referring now to FIG. 6, in preparation for the deposition of the dielectric stack, substrate 110 is placed in a reactor in step 310, such as the 300 mm plasma enhanced chemical vapor deposition tool. The precursor gas and vapor flows are stabilized in step 310 as well to reach a desired pressure that may be in the range from 0.1 torr or 100 torr, for example, 5 torr, and more preferably in the range from 3 torr to 10 torr. The wafer chuck temperature is preferably set to about 350° C., but this temperature may be in the range from 100° C. to 450° C. The starting precursors are trimethylsilane (TMS) or dimethylsilacyclopentane (DMSCP) in conjunction with ammonia ($NH_3$) and/or nitrogen ($N_2$).

A precursor including atoms of silicon (Si), carbon (C), nitrogen (N) and hydrogen (H) is introduced into the reactor in step 320 and a film is deposited on the substrate. The flow rate of $NH_3$ and/or in the reactor is reduced in step 330. Optionally, an ethylene ($C_2H_4$) porogen precursor or other hydrocarbon porogen may be added during the second layer deposition to increase the carbon concentration and produce increased porosity. A film including atoms of silicon (Si), carbon (C), nitrogen (N) and hydrogen (H) is further deposited in step 340. The composition has less nitrogen making it less dense. An ultraviolet curing is preferably performed for about 20 seconds to about 350 seconds to increase porosity in step 350.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for forming a dielectric stack structure comprising,
    introducing in a reactor a first vapor precursor comprising dimethylsilacyclopentane (DMSCP) and a second vapor precursor of at least one of ammonia and nitrogen gas;
    striking a plasma in the reactor;
    depositing a first layer of silicon, carbon, nitrogen and hydrogen on a substrate;
    reducing the flow rate of the second vapor precursor in the reactor;
    depositing a second layer of silicon, carbon, nitrogen and hydrogen onto the substrate; and
    introducing a hydrocarbon porogen precursor into the reactor; wherein the first layer is dense and the second layer is porous.

2. The method of claim 1 further comprising curing the substrate with the deposited first and second layers for at least 20 seconds under an ultraviolet wavelength.

3. The method of claim 1 further comprising placing the substrate in the reactor at a temperature of about 200° C. to about 350° C.

4. The method of claim 1 wherein the deposition is performed by plasma enhanced chemical vapor deposition.

5. The method of claim 1 further comprising:
    forming a transition layer between the first layer and the second layer
    wherein the transition layer comprises a composition of graded nitrogen (N) and graded carbon (C);
    wherein the second layer is carbon-rich and is porous; and
    wherein the first layer is dense and nitrogen-rich.

6. The method of claim 1, wherein the first layer has a dielectric constant in the range of about 3.5 to about 5.

7. The method of claim 1, wherein the second layer has a dielectric constant in the range of about 2.4 to about 3.

8. The method of claim 1, wherein the thickness of the first layer is about 15 nm to about 500 nm.

9. The method of claim 1, wherein the thickness of the second layer is about 50 nm to about 500 nm.

10. The method of claim 1, wherein the first layer has a nitrogen concentration of greater than or equal to 10 atomic percent.

11. The method of claim 1, wherein the second layer has a nitrogen concentration of less than 10 atomic percent.

12. The method of claim 1, wherein the second layer has a porosity of about 15%.

13. The method of claim 1, wherein the second layer has a carbon concentration of about 5 atomic percent to about 25 atomic percent higher than the carbon concentration of the first layer.

14. A method for forming a dielectric stack structure comprising,
    introducing in a reactor a first vapor precursor of at least one of dimethylsilacyclopentane (DMSCP) and trimethylsilane (TMS), a second vapor precursor of at least one of ammonia and nitrogen gas on a substrate, and a hydrocarbon porogen precursor;
    striking a plasma in the reactor;

depositing a first layer of silicon, carbon, nitrogen and hydrogen on the substrate;

reducing the flow rate of the second vapor precursor in the reactor; and depositing a second layer of silicon, carbon, nitrogen and hydrogen into the reactor;

wherein the first layer is dense and the second layer is porous.

15. The method of claim 14 further comprising curing the substrate with the deposited first and second layers for at least 20 seconds under an ultraviolet wavelength.

16. The method of claim 14 further comprising placing the substrate in the reactor at a temperature of about 200° C. to about 350° C.

17. The method of claim 14 wherein the deposition is performed by plasma enhanced chemical vapor deposition.

18. The method of claim 14 further comprising:

forming a transition layer between the first layer and the second layer wherein the transition layer comprises a composition of graded nitrogen (N) and graded carbon (C);

wherein the second layer is carbon-rich and is porous; and wherein the first layer is dense and nitrogen-rich.

19. The method of claim 18, wherein the first layer has a dielectric constant in the range of about 3.5 to about 5.

20. The method of claim 18, wherein the second layer has a dielectric constant in the range of about 2.4 to about 3.

21. The method of claim 18, wherein the thickness of the first layer is about 15 nm to about 500 nm.

22. The method of claim 18, wherein the thickness of the second layer is about 50 nm to about 500 nm.

23. The method of claim 18, wherein the first layer has a nitrogen concentration of greater than or equal to 10 atomic percent.

24. The method of claim 18, wherein the second layer has a nitrogen concentration of less than 10 atomic percent.

25. The method of claim 18, wherein the second layer has a porosity of about 15%.

26. The method of claim 18, wherein the second layer has a carbon concentration of about 5 atomic percent to about 25 atomic percent higher than the carbon concentration of the first layer.

\* \* \* \* \*